(12) United States Patent
Kito et al.

(10) Patent No.: US 8,847,303 B2
(45) Date of Patent: Sep. 30, 2014

(54) SEMICONDUCTOR DEVICE AND METHOD FOR MANUFACTURING THE SAME

(75) Inventors: Masaru Kito, Mie-ken (JP); Ryota Katsumata, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 13/422,294

(22) Filed: Mar. 16, 2012

(65) Prior Publication Data

US 2013/0119456 A1    May 16, 2013

(30) Foreign Application Priority Data

Nov. 16, 2011  (JP) ................................. 2011-250475

(51) Int. Cl.
  *H01L 29/792*   (2006.01)
  *H01L 27/115*   (2006.01)

(52) U.S. Cl.
  CPC ........ *H01L 29/7926* (2013.01); *H01L 27/1157* (2013.01); *H01L 27/11582* (2013.01)
  USPC ............................. 257/324; 438/488; 257/314

(58) Field of Classification Search
  USPC ................. 257/204, 314, 368, 324, 316, 326; 438/268, 216, 488
  See application file for complete search history.

(56) References Cited

U.S. PATENT DOCUMENTS

| 8,017,993 B2 * | 9/2011 | Kidoh et al. .................. 257/324 |
| 8,017,999 B2 * | 9/2011 | Suzuki .......................... 257/355 |
| 8,349,689 B2 * | 1/2013 | Lee et al. ...................... 438/268 |
| 2010/0213527 A1 * | 8/2010 | Shim et al. .................... 257/314 |
| 2010/0244119 A1 | 9/2010 | Fukuzumi et al. |
| 2011/0084331 A1 | 4/2011 | Tanaka et al. |
| 2012/0168824 A1 * | 7/2012 | Lee ............................... 257/204 |
| 2013/0109158 A1 * | 5/2013 | Lee et al. ...................... 438/488 |

FOREIGN PATENT DOCUMENTS

JP       2010-225946 A     10/2010

OTHER PUBLICATIONS

U.S. Appl. No. 13/046,819, filed Mar. 11, 2011, Tanaka et al.

* cited by examiner

*Primary Examiner* — Steven Loke
*Assistant Examiner* — David Goodwin
(74) *Attorney, Agent, or Firm* — Oblon, Spivak, McClelland, Maier & Neustadt, L.L.P.

(57) ABSTRACT

According to one embodiment, a semiconductor device includes: a substrate; a stacked body provided above the substrate, including a selector gate and an insulating layer provided on the selector gate; an insulating film provided on a sidewall of a hole formed by penetrating the stacked body in the stacking direction; a channel body and a semiconductor layer. The channel body is provided on a sidewall of the insulating film in the hole, that blocks the hole near an end of the insulating layer side in the selector gate, and that encloses a cavity below a part that blocks the hole. The semiconductor layer is formed of a same material as the channel body and is embedded continuously in the hole above the part where the channel body blocks the hole.

12 Claims, 7 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2011-250475, filed on Nov. 16, 2011; the entire contents of which are incorporated herein by reference.

FIELD

Embodiments described herein relate generally to a semiconductor device and a method for manufacturing the same.

BACKGROUND

A memory device is proposed in which a memory cell is three dimensionally arrayed by forming a memory hole in a stacked body where an electrode layer that functions as a control gate in a memory cell is stacked in a plurality to alternate with insulating layers, and, after a charge accumulation film is formed on a sidewall of the memory hole, silicon is provided to be a channel within the memory hole.

An erasing method is proposed in which a gate induced drain leakage (GIDL) current is used as a method to erase data inherent to this type of three dimensional stacked memory. A diffusion region with a high impurity concentration in the channel body near the top end of the selector gate provided above the memory cell is required to use this erasing method.

BRIEF DESCRIPTION OF THE DRAWINGS

FIGS. 3A to 7C are schematic cross-sectional views showing a manufacturing method of the semiconductor device of the embodiment.

DETAILED DESCRIPTION

In general, according to one embodiment, a semiconductor device includes: a substrate; a stacked body provided above the substrate, including a selector gate and an insulating layer provided on the selector gate; an insulating film provided on a sidewall of a hole formed by penetrating the stacked body in the stacking direction; a channel body and a semiconductor layer. The channel body is provided on a sidewall of the insulating film in the hole, that blocks the hole near an end of the insulating layer side in the selector gate, and that encloses a cavity below a part that blocks the hole. The semiconductor layer is formed of a same material as the channel body and is embedded continuously in the hole above the part where the channel body blocks the hole.

In general, according to another embodiment, a semiconductor device includes: a substrate; a first stacked body having a plurality of electrode layers and a plurality of first insulating layers stacked above the substrate so as to be respectively alternating; a memory film provided on a sidewall of a first hole formed by penetrating the first stacked body in the stacking direction; a second stacked body provided on the first stacked body, including a selector gate and a second insulating layer provided on the selector gate; an insulating film provided on a sidewall of a second hole that communicates with the first hole by penetrating the second stacked body in the stacking direction, a channel body provided on a sidewall of the memory film in the first hole and on a sidewall of the insulating film in the second hole, that blocks the second hole near the end of the second insulating layer side in the selector gate, and that encloses a cavity below a part that blocks the second hole; and a semiconductor layer that is formed of a same material as the channel body, is continuously embedded in the second hole above the part where the channel body blocks the second hole, and has a higher impurity concentration than the channel body.

In general, according to another embodiment, a method for manufacturing a semiconductor device includes: forming a stacked body above a substrate, the stacked body including a selector gate and an insulating layer provided on the selector gate; forming a hole that penetrates the stacked body in the stacking direction; forming an insulating film on a sidewall of the hole; forming a channel body on a sidewall of the insulating film, that blocks the hole near an end of the insulating layer side in the selector gate, and that encloses a cavity below a part that blocks the hole; embedding a semiconductor layer that includes impurities and is formed of formed of a same material as the channel body, after the forming of the channel body, in a same processing chamber as the processing chamber, on the inner side of the channel body in the hole above the portion where the channel body blocks the hole; and annealing the impurities contained in the semiconductor layer to diffuse to the channel body.

Embodiments will be described below with reference to drawings. Note that the same reference numerals are applied for the same elements in each drawing.

Figure 1:
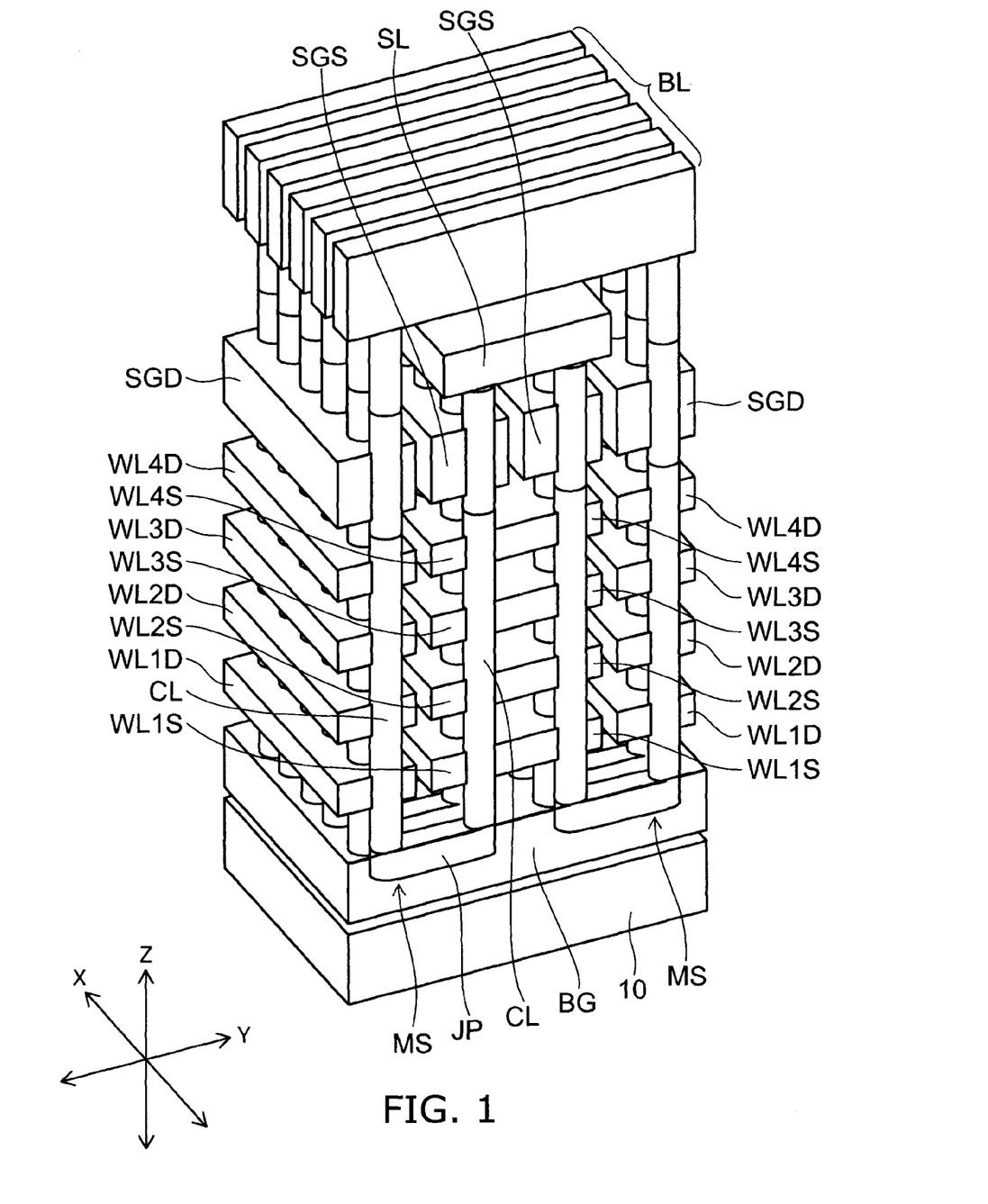
FIG. 1 is a schematic perspective view of a memory cell array in a semiconductor device of an embodiment.

FIG. 1 is a schematic perspective view of a memory cell array in a semiconductor device of an embodiment. Note, in FIG. 1, illustrations of insulating areas are omitted for easy referencing of the drawing.

Figure 2:
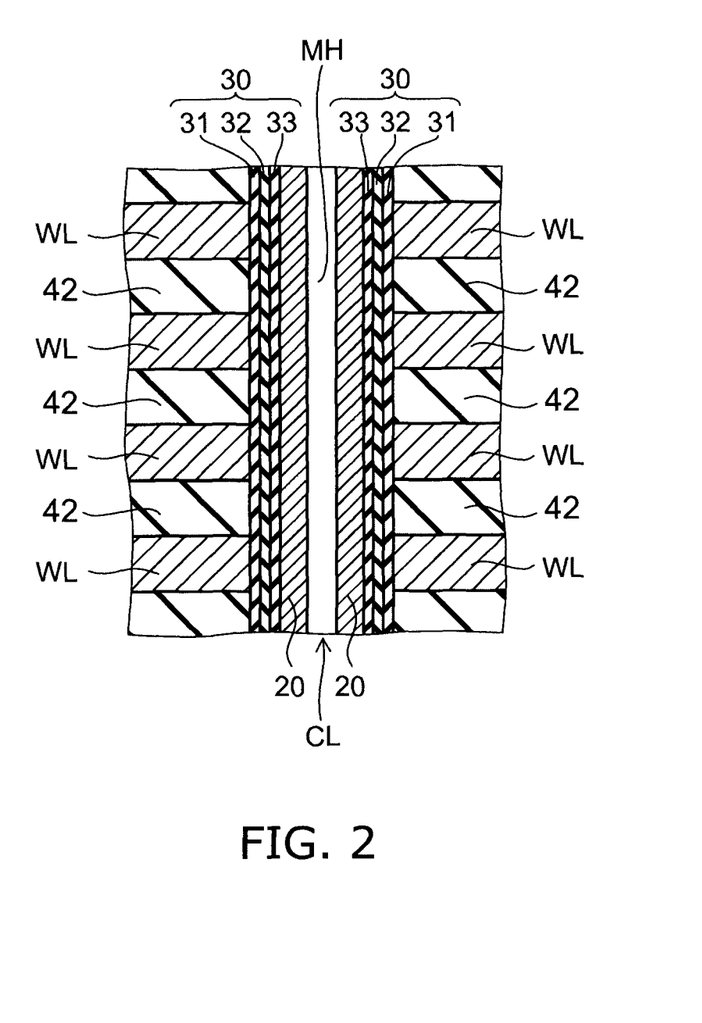
FIG. 2 is a magnified cross-sectional view of the area where the memory cells in the semiconductor device of the embodiment.

FIG. 2 is a magnified cross-sectional view of the area where the memory cells in FIG. 1 are provided.

Further, in FIG. 1, an XYZ orthogonal coordinate system is introduced for convenience of explanation. In this coordinate system, two mutually orthogonal directions parallel to the main surface of a substrate 10 are defined as the X direction and the Y direction, and the direction orthogonal to both the X direction and the Y direction is defined as the Z direction.

In FIG. 1, a back gate BG is provided on the substrate 10 via an insulating layer (not shown). For example, a conductive silicon layer to which impurities are added may be used as the back gate BG.

On the back gate BG, a plurality of first insulating layers 42 (shown in FIG. 2) is stacked alternating with a plurality of electrode layers WL1D, WL2D, WL3D, WL4D, WL1S, WL2S, WL3S, and WL4S.

The electrode layer WL1D and the electrode layer WL1S are provided on the same layer and represent a first electrode layer from the bottom (from the substrate 10). The electrode layer WL2D and the electrode layer WL2S are provided on the same layer and represent a second electrode layer from the bottom. The electrode layer WL3D and the electrode layer WL3S are provided on the same layer and represent a third electrode layer from the bottom. The electrode layer WL4D and the electrode layer WL4S are provided on the same layer and represent a fourth electrode layer from the bottom.

The electrode layer WL1D and the electrode layer WL1S are divided in the Y direction. The electrode layer WL2D and the electrode layer WL2S are divided in the Y direction. The electrode layer WL3D and the electrode layer WL3S are divided in the Y direction. The electrode layer WL4D and the electrode layer WL4S are divided in the Y direction.

Insulating film 45 is provided, as illustrated in FIG. 4B to FIG. 5B, between the electrode layer WL1D and the electrode layer WL1S, between the electrode layer WL2D and the electrode layer WL2S, between the electrode layer WL3D and the electrode layer WL3S, and between the electrode layer WL4D and the electrode layer WL4S.

The electrode layers WL1D to WL4D are provided between the back gate BG and a drain side selector gate SGD. The electrode layers WL1S to WL4S are provided between the back gate BG and a source side selector gate SGS.

The number of electrode layers is discretionary and is not limited to four layers as illustrated in the example of FIG. 1. Further, in the explanation to be given hereinafter, each of the electrode layers WL1D to WL4D and WL1S to WL4S may be expressed simply as electrode layers WL. Further, the first insulating layers 42 illustrated in FIG. 2 may simply be expressed as insulating layer 42.

For example, a conductive silicon layer to which an impurity has been added may be used as the electrode layer WL. For example, a tetraethoxysilane (TEOS) layer that contains silicon oxide may be used as the insulating layer 42.

The drain side selector gate SGD is provided on the electrode layer WL4D. For example, a conductive silicon layer to which impurities are added may be used as the drain side selector gate SGD.

The source side selector gate SGS is provided on the electrode layer WL4S. For example, a conductive silicon layer to which impurities are added may be used as the source side selector gate SGS.

The drain side selector gate SGD and the source side selector gate SGS are divided in the Y direction. Note, in the explanation to be given hereinafter, the drain side selector gate SGD and the source side selector gate SGS may be expressed simply as a selector gate SG without distinction.

A source line SL is provided on the source side selector gate SGS. For example, a metal layer may be used as the source line SL.

A plurality of bit lines BL that are metal wires is provided on the drain side selector gate SGD and the source line SL. Each bit line BL extends in the Y direction.

Figure 5A:
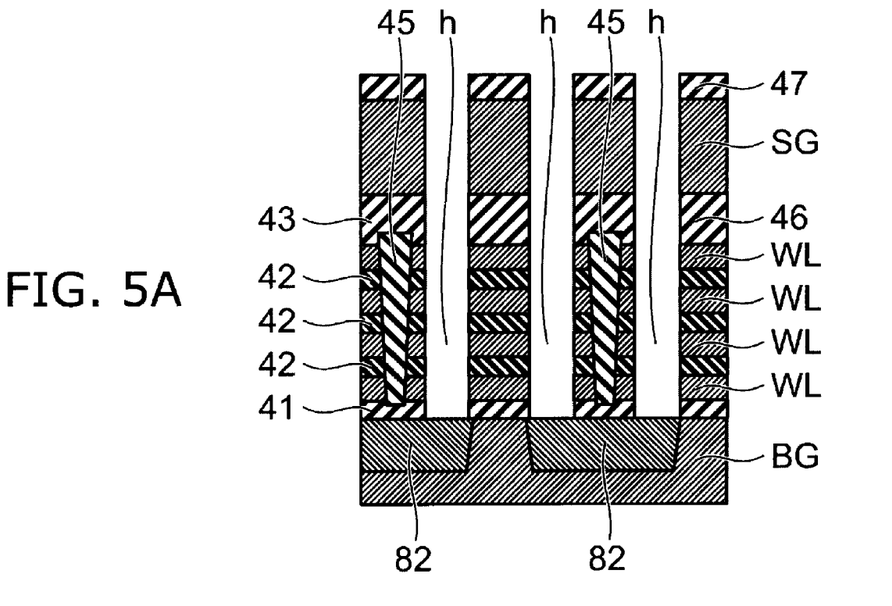
Figure 5B:
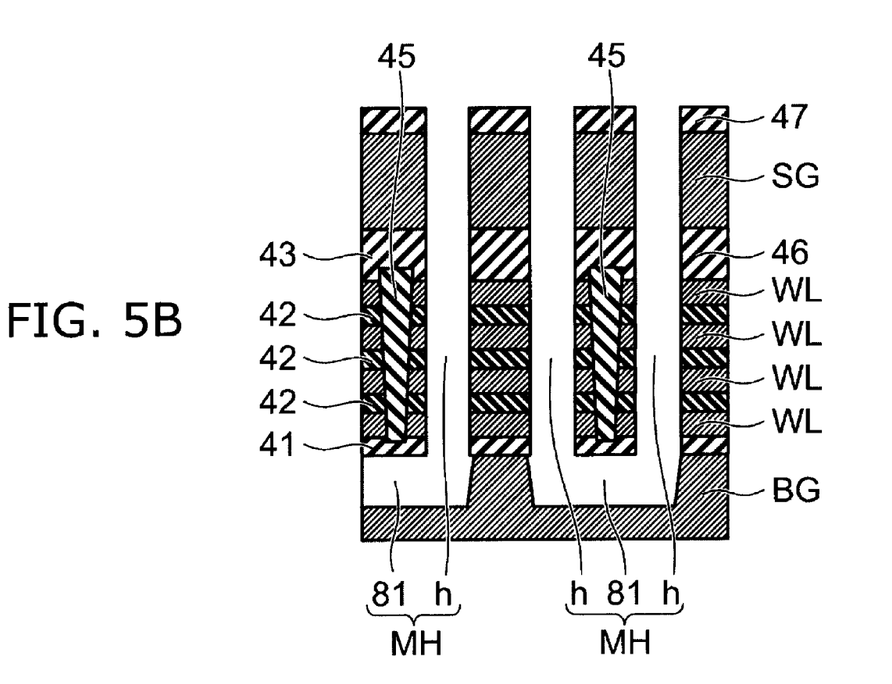

U shaped memory holes MH are formed, as illustrated in FIG. 5B, in a plurality on the back gate BG and on the stacked body on the back gate BG. Holes h that extend in the Z direction are formed by penetrating the electrode layers WL1D to WL4D and the drain side selector gate SGD. Holes h that extend in the Z direction are formed by penetrating the electrode layers WL1S to WL4S and the source side selector gate SGS. This pair of holes h that extend in the Z direction are connected through a groove 81 formed in the back gate BG to form a U shaped memory hole MH.

A channel body 20, as illustrated in FIG. 2, is provided in the memory hole MH. For example, a silicon film may be used as the channel body 20. A memory film 30 is provided between the channel body 20 and the memory hole MH.

The channel body 20 is formed such that a cavity remains on the center axis side of the memory hole MH in the area that penetrates the electrode layer WL and insulating layer 42. The channel body 20 encloses the cavity around the center axis of the memory hole MH.

Figure 7A:
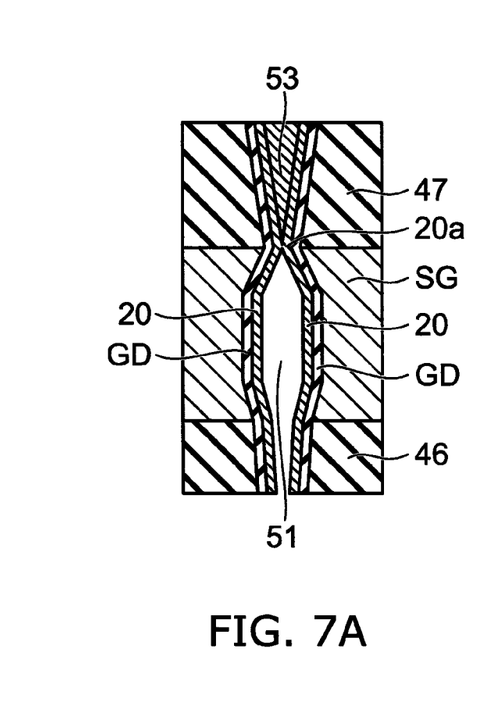
Figure 7B:
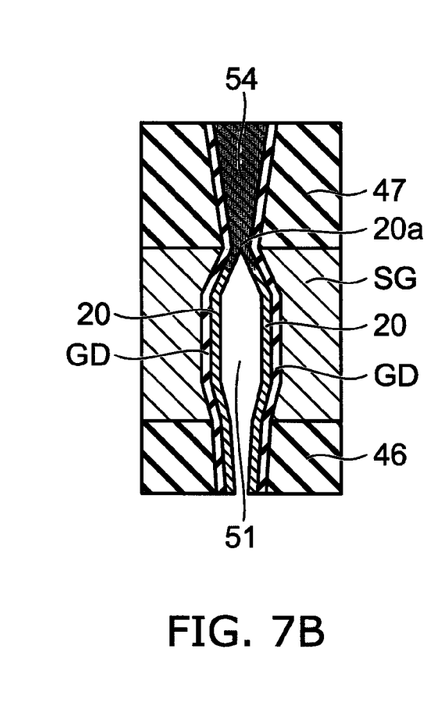
Figure 7C:
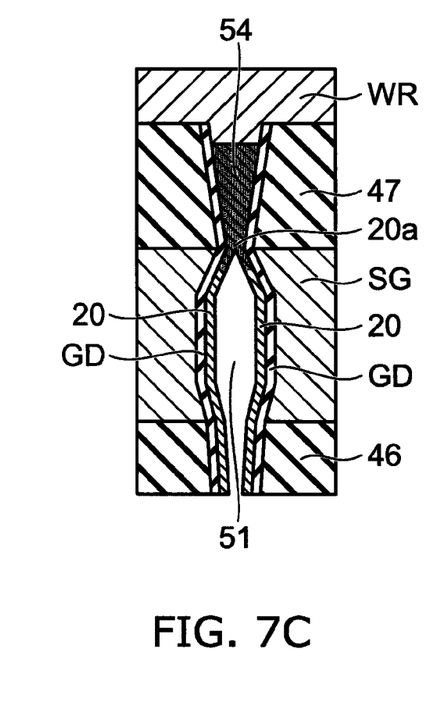

Gate insulating films GD illustrated in FIG. 7C are provided between the drain side selector gate SGD and the channel body 20 and between the source side selector gate SGS and the channel body 20.

A block film 31 as a first insulating film, a charge accumulation film 32, and a tunnel film 33 as a second insulating film are provided in that order from the electrode layer WL side, as illustrated in FIG. 2, between the channel body 20 and each of the electrode layers WL in a memory cell transistor (hereinafter also referred to simply as a memory cell). The block film 31 contacts the electrode layer WL, and the tunnel film 33 contacts the channel body 20, and the charge accumulation film 32 is provided between the block film 31 and the tunnel film 33.

The channel body 20 functions as a channel in the memory cell transistor, and the electrode layer WL functions as a control gate, and the charge accumulation film 32 functions as a data memory layer that accumulates a charge infused from the channel body 20. In other words, a memory cell is formed in a configuration in which a control gate encompasses the channel periphery at the location where the channel body 20 and each electrode layer WL intersect.

The semiconductor device of this embodiment is a non-volatile semiconductor memory device that can electrically and freely erase and write data and that can retain memory content even if the power is cut.

The memory cell is, for example, a charge trap type of memory cell. The charge accumulation film 32 has a plurality of trap sites that capture a charge and, for example, a silicon nitride film can be used therefor.

For example, a silicon oxide film can be used as the tunnel film 33 which functions as a potential barrier when a charge is infused from the channel body 20 into the charge accumulation film 32 or when the charge that is accumulated in the charge accumulation film 32 is diffused to the channel body 20.

For example, a silicon oxide film may be used as the block film 31 to prevent the charge that is accumulated in the charge accumulation film 32 from diffusing to the electrode layer WL.

The drain side selector gate SGD, the channel body 20, and the gate insulating film GD therebetween configure a drain side select transistor. The channel body 20 in the drain side select transistor is connected to the bit line BL.

The source side selector gate SGS, the channel body 20, and the gate insulating film GD therebetween configure a source side select transistor. The channel body 20 in the source side select transistor is connected to the source line SL.

The back gate BG, channel body 20 provided in the back gate BG, and the memory film 30 configure a back gate transistor.

Memory cells using each of the electrode layers WL4D to WL1D as a control gate are provided in a plurality between the drain side select transistor and the back gate transistor. In a similar manner, memory cells using each of the electrode layers WL1S to WL4S as a control gate are also provided in a plurality between the back gate transistor and the source side select transistor.

These memory cells in a plurality, the drain side select transistor, the back gate transistor, and the source side select transistor are serially connected through the channel body 20 and configure a single U shaped memory string MS.

One memory string MS includes a pair of column parts CL that extend in the stacking direction of the stacked body, and that contains the plurality of electrode layers WL, and a junction part JP that is embedded in the back gate BG and is connected to the bottom end of the pair of column parts CL. This memory string MS is arrayed in plurality in the X direction and the Y direction, and therefore, a plurality of memory cells is three dimensionally provided in the X direction, Y direction, and Z direction.

Next, a description is provided for a manufacturing method of a memory cell array in a semiconductor device of an embodiment with reference to FIGS. 3A to 7C.

Figure 3A:
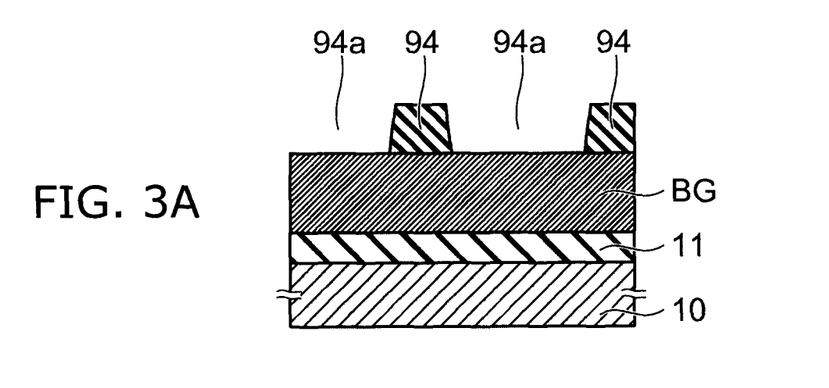

FIG. 3A illustrates the back gate BG provided on the substrate 10 via insulating layer 11. Note that examples of the substrate 10 and insulating layer 11 are omitted in the process cross sectional views of FIG. 3B and thereafter.

A resist 94 is formed on the back gate BG. The resist 94 undergoes patterning and an opening 94a is selectively formed in the resist 94.

Figure 3B:
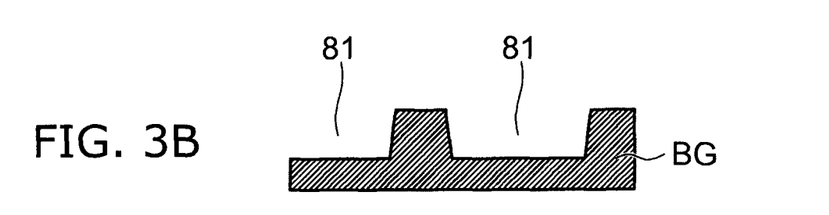

The back gate BG selectively undergoes dry etching using the resist 94 as a mask. By so doing, a groove (or recess) 81 is formed in the back gate BG as illustrated in FIG. 3B.

Figure 3C:
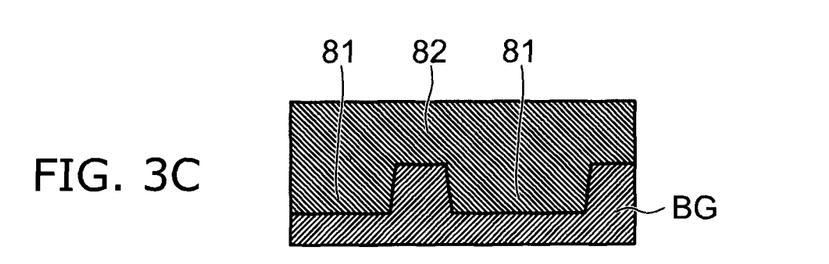
Figure 3D:
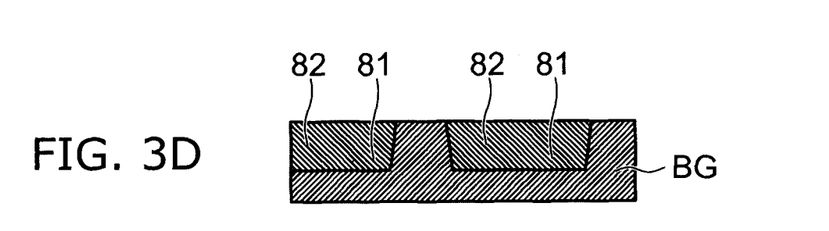

A sacrifice film 82 is embedded in the groove 81 as illustrated in FIG. 3C. For example, a silicon nitride film may be used as the sacrifice film 82. Afterwards, as illustrated in FIG. 3D, the entire surface of the sacrifice film 82 undergoes etching to expose the top surface of the back gate BG between the groove 81 and the groove 81.

Figure 4A:
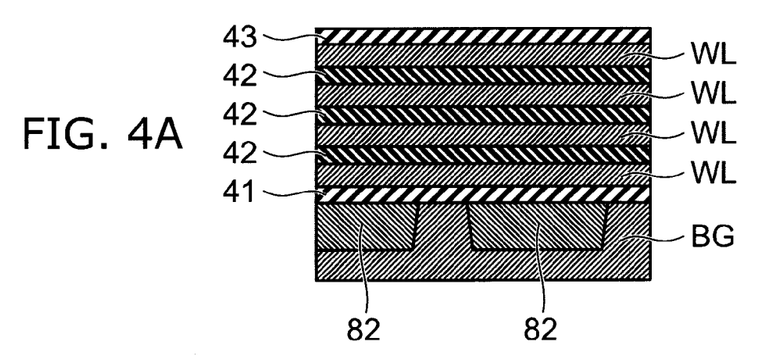

Next, as illustrated in FIG. 4A, after an insulating layer 41 is formed on the back gate BG, the first stacked body that includes a plurality of electrode layers WL and a plurality of insulating layers 42 is formed thereon. The electrode layers WL and the insulating layers 42 are alternately stacked, and the insulating layers 42 are interposed between the electrode layers WL. An insulating layer 43 is formed on the topmost layer of the electrode layer WL.

Figure 4B:
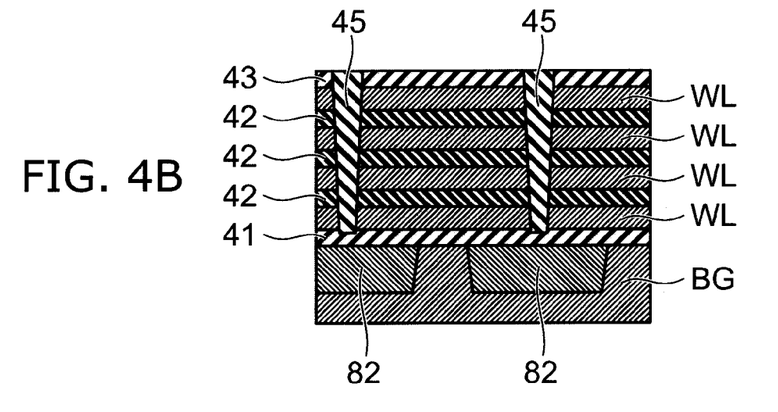

Next, after the first stacked body is divided by photolithography and etching and a groove that reaches the insulating layer 41 has been formed, such groove is embedded with the insulating film 45 as illustrated in FIG. 4B.

Figure 4C:
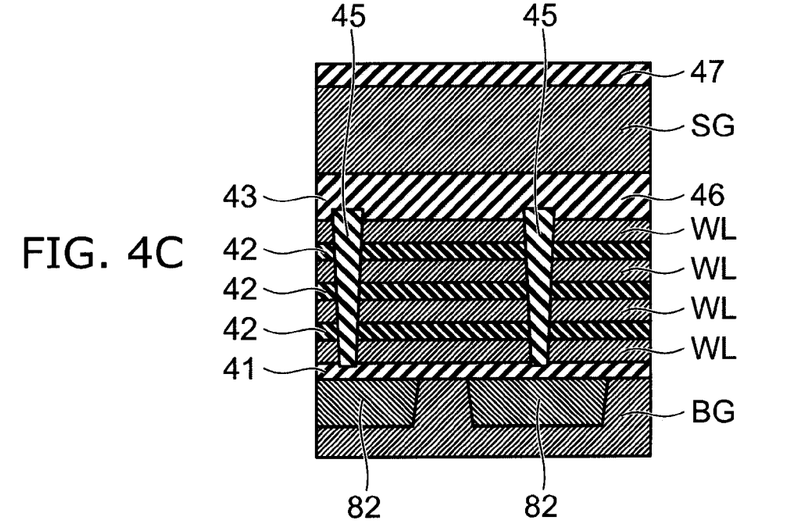

After embedding the groove with the insulating film 45, the insulating layer 43 is exposed by etching the entire surface. An insulating layer 46 is formed on the insulating layer 43 as illustrated in FIG. 4C.

Further, a second stacked body that includes a selector gate SG and a second insulating layer (hereinafter may be referred to simply as an insulating layer) 47 is formed on the insulating layer 46. The selector gate SG is formed on the insulating layer 46, and the insulating layer 47 is formed on the selector gate SG. The selector gate SG is divided in a process to be described below to become either the drain side selector gate SGD or the source side selector gate SGS.

Next, as illustrated in FIG. 5A, the hole h is formed on the first staked body and the second stacked body described above on the back gate BG. The hole h is formed by, for example, a reactive ion etching (RIE) method in which a mask (not illustrated) is used. The bottom end of the hole h reaches the sacrifice film 82 and the sacrifice film 82 is exposed at the bottom of the hole h. A pair of holes h is positioned over one sacrifice film 82 such that the insulating film 45 positioned substantially in the center of the sacrifice film 82 is sandwiched.

Next, the sacrifice film 82 is removed through the hole h by, for example, wet etching. The etching solution used at this time may be, for example, an alkali-based chemical solution of KOH (potassium hydroxide) solution or the like or a phosphoric acid solution ($H_3PO_4$) in which the etching rate has been adjusted depending on temperature conditions.

By so doing, the sacrifice film 82 is removed as illustrated in FIG. 5B. By removing the sacrifice film 82, the groove 81 is formed in the back gate BG. A pair of holes h is connected with one groove 81. In other words, the respective bottom ends of a pair of holes h are connected with a single common groove 81 to form one U shaped memory hole MH.

Afterwards, the memory film 30 illustrated in FIG. 2 is formed on a sidewall of the memory hole MH in the first stacked body that has a plurality of electrode layers WL. Further, the channel body 20 is formed on an inner side of the memory film 30 within the memory hole MH.

Meanwhile, a process is performed subsequent to FIG. 6A, to be described below, on the second stacked body that includes the selector gate SG.

In the semiconductor device of this embodiment, an erasing operation of data is an operation in which electrons are extracted from the charge accumulation film 32 or electron holes are infused into the charge accumulation film 32. The transistor that configures the memory cell using the electrode layer WL as a control gate includes a state where the threshold voltage is relatively low (erasing state) and a state where the threshold voltage is relatively high (writing state). In addition, the erasing operation is an operation where the state of the threshold voltage of the memory cell is set to be on the low side.

Generally, in memory with a two-dimensional structure, electrons written to a floating gate are extracted by raising the substrate potential. However, with this type of semiconductor device with a three dimensional structure of this embodiment, the channel of the memory cell is not directly connected to the substrate. Therefore, a method is proposed to boost the channel potential of the memory cell by utilizing the gate induced drain leakage (GIDL) current generated by the channel at an end of the selector gate.

In other words, applying a high voltage to a diffusion region to which a high concentration of impurities has been added formed on the channel body 20 near the top end of the selector gate SG generates a high electric field in a depletion layer formed between the selector gate SG and the diffusion region. By doing this, interband tunneling is brought about to raise the channel potential by supplying the generated electron hole to the channel body 20. An erasing operation can be performed by making the potential of the electrode layer WL to be, for example, a ground potential (0V) and extracting electrons from the charge accumulation film 32 by the electric potential difference between the channel body 20 and the electrode layer WL, or by infusing an electron hole into the charge accumulation film 32.

A diffusion region that has a high impurity concentration on the channel body 20 near the top end of the selector gate SG is required in order to increase the speed of this type of erasing operation.

A description is given of the manufacturing method and a structure of select transistors (drain side select transistor and source side select transistor) in the embodiments with reference to FIGS. 6A to 7C.

Note that particularly with the memory hole MH, a portion that penetrates the second stacked body that includes the selector gate SG and the insulating layer 47 becomes a hole h2.

Figure 6A:
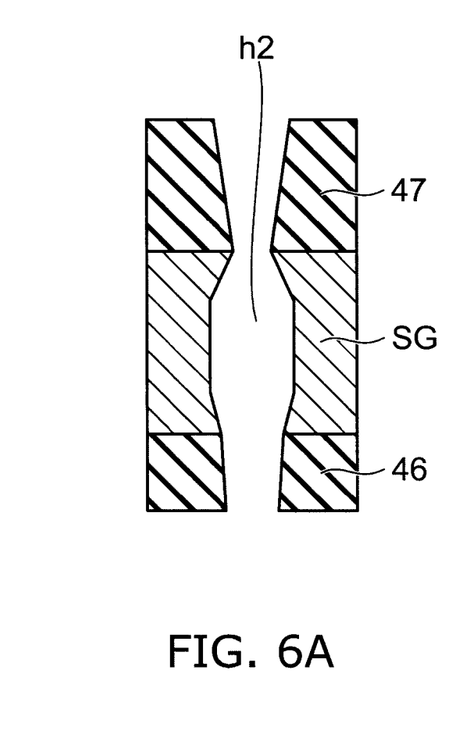

FIG. 6A illustrates a state in which the hole h2 is formed in the second stacked body.

The hole h2 is formed so that the diameter thereof is narrowest near the top end of the insulating layer 47 side in the selector gate SG. The hole h2 is formed by, for example, a reactive ion etching (RIE) method.

A wafer on which the stacked body is formed is held by a wafer holding part in a processing chamber. In addition, a desired gas is introduced into the processing chamber and electricity is applied between the wafer holding part that functions as a lower electrode and an upper electrode that faces the wafer holding part, and a discharge is generated in the processing chamber. Controlling the type of gas, gas flow, and the size of electricity, and the like, at this time, controls the shape and diameter of the hole h2.

When etching near the top end of the insulating layer 47 side in the selector gate, as compared to etching at times in other areas, for example, by increasing the electricity applied to the wafer side, etching can be made to be dominant in the vertical direction (stacking method) while suppressing etching in the horizontal direction.

Figure 6B:
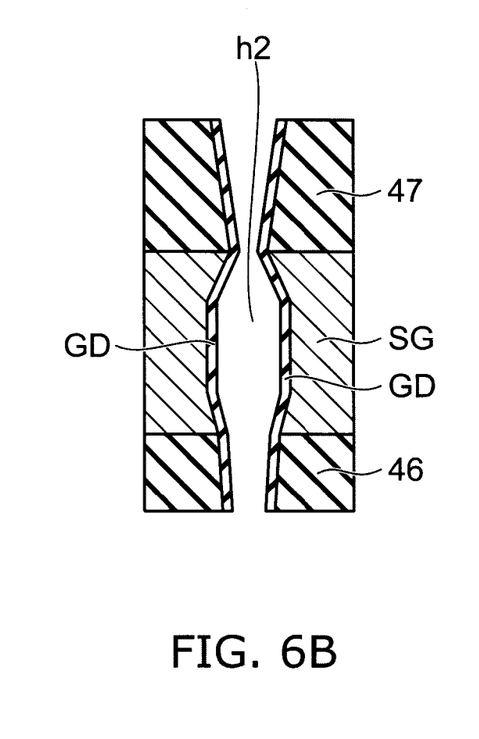

After formation of the hole h2, the gate insulating film GD is formed on a sidewall of the hole h2 as illustrated in FIG. 6B. For example, a silicon oxide film or a silicon nitride film may be used as the gate insulating film GD. For example, a stacked film that includes a block film (silicon oxide film), charge accumulation film (silicon nitride film), and a tunnel film (silicon oxide film) stacked in that order from the selector gate SG side may be used as the gate insulating film GD.

Figure 6C:
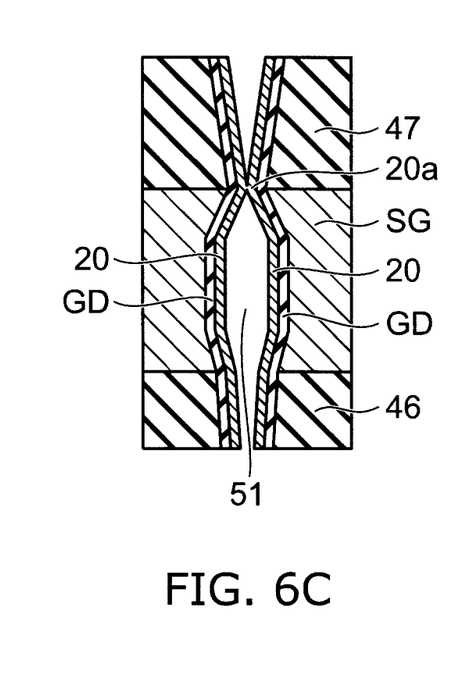

Next, as illustrated in FIG. 6C, the channel 20 is formed on the inner side of the gate insulating film GD in the hole h2. For example, a non-doped amorphous silicon film is formed as the channel body 20. Here, non-doped indicates that no other impurities are intentionally added to the silicon film other than the elements originating in the source gas at the time of film formation.

The diameter of the hole h2 is narrowest near the top end of the insulating layer 47 side in the selector gate SG. Accordingly, the channel body 20 blocks the hole h2 near the top end of the insulating layer 47 side in the selector gate SG and encloses a cavity 51 around the center axis of the hole h2 below a blocking part 20a thereof.

Next, as illustrated in FIG. 7A, a semiconductor layer 53 is embedded in the inner side of the channel body 20 above the blocking part 20a of the channel body 20. Although the semiconductor layer 53 is amorphous silicon which is the same material as the channel body 20, the semiconductor layer 53 contains impurities in contrast to the non-doped channel body 20. The semiconductor layer 53 contains, for example, an n-type impurity as an impurity that allows conductivity in the semiconductor layer 53. Or, the semiconductor layer 53 may contain a p-type impurity.

The channel body 20 and the semiconductor layer 53 are formed successively in the same processing chamber without atmospheric release. The channel body 20 is formed by, for example, a chemical vapor deposition (CVD) method in which a source gas containing silicon is used, and subsequently, after adding the source gas containing silicon, a gas containing impurities (for example, a phosphine ($PH_3$) gas) is introduced into the processing chamber to form the semiconductor layer 53. Accordingly, an oxide film is not formed in the interface of the channel body 20 and the semiconductor layer 53.

Afterwards, annealing is performed. Performing annealing turns the channel body 20 and the semiconductor layer 53 into polycrystalline silicon. In other words, the channel body 20 and semiconductor layer 53 above the blocking part 20a become, as illustrated in FIG. 7B, a semiconductor layer 54 configured of contiguous and integral polycrystalline silicon. Here, "contiguous and integral" indicates that there is no interface between the channel body 20 and the semiconductor 53 and that an oxide film is also not interposed therebetween.

Further, the annealing diffuses the impurities contained in the semiconductor layer 53 into the channel body 20. The impurities are diffused to the area near the blocking part 20a in the channel body 20 between the semiconductor layer 54 and the selector gate SG.

Accordingly, the impurity concentration of the semiconductor layer 54 and the impurity concentration of the channel body 20 near the blocking part 20a are higher than the impurity concentration of the channel body 20 between the selector gates SG and the impurity concentration of the channel body 20 of the memory cell. The impurity concentration of the semiconductor layer 54 and the impurity concentration of the channel body 20 near the blocking part 20a (the impurity concentration of the portion where dots are added in FIG. 7B) are, for example, between about $1\times10^{18}\,cm^{-3}$ to $1\times10^{19}\,cm^{-3}$.

After the semiconductor layer 54 is formed, a recess is made by etching the top part of the semiconductor layer 54. Afterwards, an interconnect WR that is to be either a bit line BL or a source line SL is formed on the recessed portion of the semiconductor layer 54 and on the insulating layer 47. The semiconductor 54 is connected to the interconnect WR. Accordingly, the channel body 20 is connected to the interconnect WR through the semiconductor layer 54.

According to the embodiment, there is a diffusion region that has a high impurity concentration in the channel body 20 (also included in the portion that is integrated with the semiconductor layer 54) near the top end of the selector gate SG. As a result, the channel potential of the memory cell can be given a rapid boost by utilizing the GIDL current described above and thus accelerating the erasing operation.

Note that a method described below can be given as a comparative example.

After the hole h2 is formed, the insulating film GD is formed on the sidewall thereof, and then the channel body is formed on the sidewall of the insulating film GD without blocking mid-way. A stacked film that includes a block film (silicon oxide film), charge accumulation film (silicon nitride film), and a tunnel film (silicon oxide film) stacked in that order from the selector gate side may be used, for example, as the gate insulating film GD. Afterwards, a core insulating film is embedded in the inner side of the channel body in the hole h2. Thereafter, a recess process is performed that removes the core insulating film by etching to near the top end of the selector gate SG, and a non-doped silicon film is embedded in the portion where the core insulating film was removed. After that, a recess is made in the non-doped silicon film to near the top end of the selector gate SG, and a cap silicon film that includes impurities is embedded in the recessed portion.

Highly precise positioning of the high impurity concentration diffusion region is required in regard to the selector gate SG in order to effectively generate GIDL near the top end of the selector gate SG. However, in the comparative example given above, control of both the impurity concentration and position of the diffusion region is difficult with variances in characteristics occurring easily as well as a tendency to increase the number of processes.

In the comparative example described above, examples of causing a variance in the impurity concentration and depth of the diffusion region include a plurality of times for the recess process and the existence of interface resistance between the channel body and the cap silicon layer making up the impurity diffusion source.

In contrast to this, according to the embodiment, after the channel body 20 is formed, the bottom end position of the semiconductor layer 53 that contains impurities, and that is embedded on the inner side thereof is determined by the position of the blocking part 20a of the channel body 20. Position control of the blocking part 20a is easier than retreat position control of a film by recess etching, and controlling the position of the blocking part 20a to near the top end of the selector gate SG enables the diffusion region with a high impurity concentration to be formed stably near the top end of the selector gate SG.

In other words, according to the embodiment, variance in the embedded position of the semiconductor layer 53, which is the impurity diffusion source, can be suppressed to a greater extent than the comparative example in which the depth position of the impurity diffusion source is determined through a recess process a plurality of times.

Further, according to the embodiment, there is no interface between the channel body 20 near the top end of the selector gate SG and the semiconductor layer 54, and a natural oxide film is also not interposed therebetween. Therefore, a rise in resistance caused by interface resistance between the semiconductor layer which is the impurity diffusion source and the channel body is not induced.

As described above, according to the embodiment, recess processing is eliminated and a structure can be realized that does not have an interface between silicon layers in the impurity diffusion region. As a result, both process elimination and process stabilization are achieved in addition to providing a select transistor, and thus a memory cell array, with a vertical structure where the device characteristics are consistent.

Inside the hole h2 below the blocking part 20a, a cavity 51 is formed on the inner side of the channel body 20 between the selector gates SG and on the inner side of the channel body 20 in the memory cell without being embedded with the insulating layer or the channel body 20. Virtually no impurities are contained in the channel body 20 that encloses the cavity 51.

Therefore, drop in voltage resistance of the gate insulting film GD due to the gate insulating film being exposed to a high impurity concentration, and threshold variance brought about due to a high impurity concentration being supplied to the channel body 20 of the select transistor or the memory cell, can be prevented.

Further, the sidewall of the inner side of the channel body 20 is directly exposed to the cavity 51 without the insulating film being formed on the inner side of the channel body 20 adjacent to the cavity 51. Therefore, threshold variance shifting of the select transistor and memory cell caused by the charge trap level of the interface between the insulating film and the channel body 20 can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a substrate;
a stacked body provided above the substrate, including a selector gate and an insulating layer provided on the selector gate;
an insulating film provided on a sidewall of a hole formed by penetrating the stacked body in the stacking direction;
a channel body provided on a sidewall of the insulating film in the hole, that blocks the hole near an end of an insulating layer side in the selector gate, and that encloses a cavity below a part that blocks the hole; and
a semiconductor layer that is formed of a same material as the channel body and is embedded in the hole above the part where the channel body blocks the hole the semiconductor layer continuously and integrally provided on the part where the channel body blocks the hole,
an impurity concentration of the semiconductor layer and an impurity concentration of the part where the channel body blocks the hole being higher than an impurity concentration of another part of the channel body other than the part where the channel body blocks the hole.

2. The device according to claim 1, wherein a diameter of the hole is narrowest near the end of the insulating layer side in the selector gate.

3. The device according to claim 1, wherein there is no interface between the channel body and the semiconductor layer, and a natural oxide film is not interposed.

4. The device according to claim 1, wherein the channel body is directly exposed to the cavity.

5. The device according to claim 1, wherein the channel body and the semiconductor layer are made of contiguous and integral polycrystalline silicon.

6. A semiconductor device comprising:
a substrate;
a first stacked body having a plurality of electrode layers and a plurality of first insulating layers stacked above the substrate so as to be respectively alternating;
a memory film provided on a sidewall of a first hole formed by penetrating the first stacked body in the stacking direction;
a second stacked body provided on the first stacked body, including a selector gate and a second insulating layer provided on the selector gate;
an insulating film provided on a sidewall of a second hole that communicates with the first hole by penetrating the second stacked body in the stacking direction,
a channel body provided on a sidewall of the memory film in the first hole and on a sidewall of the insulating film in the second hole, that blocks the second hole near an end of a second insulating layer side in the selector gate, and that encloses a cavity below a part that blocks the second hole; and
a semiconductor layer that is formed of a same material as the channel body, is embedded in the second hole above the part where the channel body blocks the second hole, the
semiconductor lager continuously and integrally provided on the part where the channel body blocks the second hole,
an impurity concentration of the semiconductor layer and an impurity concentration of the part where the channel body blocks the second hole being higher than an impurity concentration of another part of the channel body other than the part where the channel body blocks the second hole.

7. The device according to claim 6, wherein the cavity is provided in the first hole and in the second hole.

8. The device according to claim 6, wherein the memory film and the insulating film include a stacked film in which a charge accumulation film is sandwiched by a pair of silicon oxide films.

9. The device according to claim 6, wherein a diameter of the second hole is narrowest near the end of the second insulating layer side in the selector gate.

10. The device according to claim 6, wherein there is no interface between the channel body and the semiconductor layer, and a natural oxide film is not interposed.

11. The device according to claim 6, wherein the channel body is directly exposed to the cavity.

12. The device according to claim 6, wherein the channel body and the semiconductor layer are made of contiguous and integral polycrystalline silicon.

* * * * *